(12) United States Patent
Shea (10) Patent No.: US 8,421,473 B2
(45) Date of Patent: Apr. 16, 2013

(54) APPARATUS AND METHOD TO DETECT A SERIES ARC FAULT OF AN ELECTRICAL CIRCUIT

(75) Inventor: John J. Shea, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 347 days.

(21) Appl. No.: 12/776,556

(22) Filed: May 10, 2010

(65) Prior Publication Data

US 2011/0273183 A1 Nov. 10, 2011

(51) Int. Cl.
*G01R 31/08* (2006.01)

(52) U.S. Cl.
USPC .............................................. 324/536; 361/42

(58) Field of Classification Search ............. 361/42; 324/536
See application file for complete search history.

(56) References Cited

U.S. PATENT DOCUMENTS

| | | | |
|---|---|---|---|
| 5,223,795 A * | 6/1993 | Blades | 324/536 |
| 5,224,006 A | 6/1993 | MacKenzie et al. | |
| 5,691,869 A | 11/1997 | Engel et al. | |
| 5,835,321 A * | 11/1998 | Elms et al. | 361/45 |
| 6,522,228 B2 | 2/2003 | Wellner et al. | |
| 6,522,509 B1 | 2/2003 | Engel et al. | |
| 6,542,056 B2 | 4/2003 | Nerstrom et al. | |
| 6,710,688 B2 | 3/2004 | Wellner et al. | |
| 8,089,737 B2 * | 1/2012 | Parker et al. | 361/42 |

* cited by examiner

*Primary Examiner* — Melissa Koval
*Assistant Examiner* — Feba Pothen
(74) *Attorney, Agent, or Firm* — Eckert Seamans Cherin & Mellott, LLC; Kirk D. Houser (57) ABSTRACT

An apparatus is for a power circuit providing an alternating current to a load. The apparatus includes a high frequency current sensor structured to cooperate with the power circuit to provide a high frequency current signal. A voltage zero crossing detector is structured to cooperate with the power circuit to provide a voltage zero crossing signal. A high pass filter is structured to provide a filtered current signal from the high frequency current signal. A threshold comparator is structured to provide an output when the filtered current signal exceeds a predetermined value. A processor is structured to receive the voltage zero crossing signal and the output of the threshold comparator and output a trip signal in response to undesired series arcing by detecting an unsymmetrical high frequency signal for a predetermined number of cycles.

12 Claims, 5 Drawing Sheets

APPARATUS AND METHOD TO DETECT A SERIES ARC FAULT OF AN ELECTRICAL CIRCUIT

BACKGROUND

1. Field

The disclosed concept pertains generally to detection apparatus for electrical circuits and, more particularly, to detection of series arc faults by an arc fault circuit interrupter or an arc fault detection, monitoring or protection apparatus. The disclosed concept also pertains to methods of detecting series arc faults of an electrical circuit.

2. Background Information

Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

An arc fault circuit interrupter (AFCI) is a device intended to mitigate the effects of arc faults by functioning to deenergize an electrical circuit when an arc fault is detected. Non-limiting examples of AFCIs include: (1) arc fault circuit breakers; (2) branch/feeder arc fault circuit interrupters, which are intended to be installed at the origin of a branch circuit or feeder, such as a panelboard, and which may provide protection from series arc faults, ground faults and line-to-neutral faults up to the outlet; (3) outlet circuit arc fault circuit interrupters, which are intended to be installed at a branch circuit outlet, such as an outlet box, in order to provide protection of cord sets and power-supply cords connected to it (when provided with receptacle outlets) against the unwanted effects of arcing, and which may provide protection from series arc faults, line-to-ground faults and line-to-neutral faults; (4) cord arc fault circuit interrupters, which are intended to be connected to a receptacle outlet, in order to provide protection to an integral or separate power supply cord; (5) combination arc fault circuit interrupters, which function as either a branch/feeder or an outlet circuit AFCI; and (6) portable arc fault circuit interrupters, which are intended to be connected to a receptacle outlet and provided with one or more outlets.

During sporadic arc fault conditions, the overload capability of a conventional circuit breaker will not function since the root-mean-squared (RMS) value of the fault current is too small to activate the automatic magnetic trip circuit. The addition of electronic arc fault sensing to a circuit breaker can add one of the elements needed for sputtering arc fault protection—ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006.

Arc faults can be series or parallel. Examples of a series arc are a broken wire where the ends of the broken wire are close enough to cause arcing, or a relatively poor electrical connection. Parallel arcs occur between conductors of different potential including, for example, a power conductor and a ground. Unlike a parallel arc fault, series arc faults do not usually create an increase in current since the fault is in series with the load. In fact, a series arc fault may result in a slight reduction in load current and not be detected by the normal overload and overcurrent protection of conventional protection devices.

Both safe and unsafe series arcs occur in power circuits, such as electrical power distribution systems (or electrical distribution systems). One example of safe series arcs occurs in the commutator brushes of direct current (DC) and universal motors. In order to minimize brush heating and erosion, universal motors are designed to minimize the net duration and thereby the total energy dissipated by commutation arcing. The materials and physical shape of the commutator brushes are chosen, in order that they are minimally affected by the arcing. Hence, the series arcs that occur in universal motors are intended and perform a constructive purpose.

Series arcs generate broadband high frequency power line noise. Commutation arcs in motors consist of a series of discretely spaced, very short-lived arcs, which strike and quench repeatedly throughout each half-cycle. These arcs are manifested by a series of discretely spaced, very short-lived bursts of broadband noise on the power line. Similarly, loads with power electronics produce broadband noise as a result of current commutation in switching devices. These commutation events are also manifested by a series of discretely spaced, very short-lived bursts of broadband noise on the power line. Series arcs which consist of relatively many brief pulses whose net conduction time is relatively small compared to the half-cycle period of the source voltage dissipate much less energy than series arcs which are continuous and persist over a sizable fraction of each half-cycle.

In contrast, a combination of random processes is known to produce an unintended series arc in electrical distribution systems. The unintended series arcs may become hazardous when the net duration and total energy dissipation of the arc are uncontrolled, and localized heating produced by the arc may damage or even ignite things nearby. Thus, unsafe series arcs in electrical distribution systems could theoretically result in loss of property or even life.

Arcs that safely occur within universal motors and unsafe series arcs that happen by random chance are similar physical phenomena; however, one occurs by design and creates a benefit while the other is unintended and may be destructive. Thus, there is a need for circuit interrupters that accurately distinguish between safe series arcing (e.g., without limitation, in universal motors) and unintended, potentially hazardous series arcs, and trip in response to only the latter. This need is further compounded by the reality that, of all series arcs in power distribution systems, only a fraction are the unintended, unsafe variety.

There is room for improvement in apparatus to detect series arc faults, such as arc fault circuit interrupters.

There is also room for improvement in methods of detecting series arc faults.

SUMMARY

These needs and others are met by embodiments of the disclosed concept, which discriminate between intended loads with relatively high harmonics (e.g., without limitation, motors; fluorescent lights) and undesired series arcing. Asymmetric electrodes produce relatively high frequency radiation only during one polarity and not the opposite polarity. The disclosed concept discriminates between undesired series arcing and relatively high harmonics of various intended loads.

In accordance with one aspect of the disclosed concept, an apparatus for a power circuit providing an alternating current to a load comprises: a high frequency current sensor structured to cooperate with the power circuit to provide a high frequency current signal; a voltage zero crossing detector structured to cooperate with the power circuit to provide a voltage zero crossing signal; a high pass filter structured to provide a filtered current signal from the high frequency current signal; a threshold comparator structured to provide an output when the filtered current signal exceeds a predetermined value; and a processor structured to receive the voltage zero crossing signal and the output of the threshold comparator and output a trip signal in response to undesired series arcing by detecting an unsymmetrical high frequency signal for a predetermined number of cycles.

As another aspect of the disclosed concept, a method of detecting a series arc fault of an electrical circuit comprises: sensing a high frequency signal caused by the series arc fault; and for a number of pairs of alternating current half cycles including a positive half cycle and a negative half cycle, incrementing a first count if the high frequency signal is above a first threshold for the positive half cycle, incrementing a second count if the high frequency signal is above the first threshold for the negative half cycle, and determining if an absolute value of the difference between the first count and the second count is greater than a second threshold, and then responsively detecting the series arc fault.

The method may further comprise detecting a voltage zero crossing between the positive half cycle and the negative half cycle or between the negative half cycle and the positive half cycle.

The method may further comprise inputting the high frequency signal by a log amplifier and outputting a corresponding signal; determining if the corresponding signal is greater than the first threshold for the positive half cycle and responsively accumulating the first count, and otherwise decrementing the first count; measuring first current for the positive half cycle; determining if the corresponding signal is greater than the first threshold for the negative half cycle and responsively accumulating the second count, and otherwise decrementing the second count; measuring second current for the negative half cycle; determining if both the positive half cycle and the negative half cycle are present from the measured first current and the measured second current and incrementing an accumulator by an absolute value of the difference between the first count and the second count, and otherwise, zeroing the first count and the second count; determining if the absolute value of the difference between the first count and the second count is zero and responsively decrementing the accumulator by a first predetermined value; and determining if the accumulator is greater than a second predetermined value and responsively indicating a series arc fault.

As another aspect of the disclosed concept, an apparatus to detect a series arc fault of an electrical circuit comprises: a sensor structured to sense a high frequency signal caused by the series arc fault; and a processor cooperating with the sensor, for a number of pairs of alternating current half cycles including a positive half cycle and a negative half cycle, to: increment a first count if the high frequency signal is above a first threshold for the positive half cycle, increment a second count if the high frequency signal is above the first threshold for the negative half cycle, and determine if an absolute value of the difference between the first count and the second count is greater than a second threshold, and then responsively detect the series arc fault.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "high frequency" means a frequency greater than about 1 MHz.

The disclosed concept is described in association with an arc fault circuit breaker, although the disclosed concept is applicable to a wide range of arc fault circuit interrupters and arc fault detection, monitoring or protection apparatus.

When using a conventional series arc generator (not shown) for the UL 1699 Standard (Arc-Fault Circuit-Interrupters), the applicant has observed an asymmetry in a high frequency arcing signature that is dependent upon polarity. This polarity dependence can advantageously be employed to identify a series arc as contrasted with relatively high harmonics from various intended loads. For example, when using graphite/copper electrodes (not shown), used to replicate series arcing faults in wiring and fixtures (not shown), a broadband high frequency signal is emitted from the arc and is coupled to the wiring. This signal appears when the copper electrode is negative (cathode) and the graphite electrode is positive (anode). Conversely, when the polarity of the system voltage changes, thereby making the graphite electrode negative (cathode) and the copper electrode positive (anode), the broadband high frequency signal disappears or is greatly diminished. This asymmetric behavior can advantageously be employed to reliably identify a series arc in the UL 1699 Standard.

Figure 1:
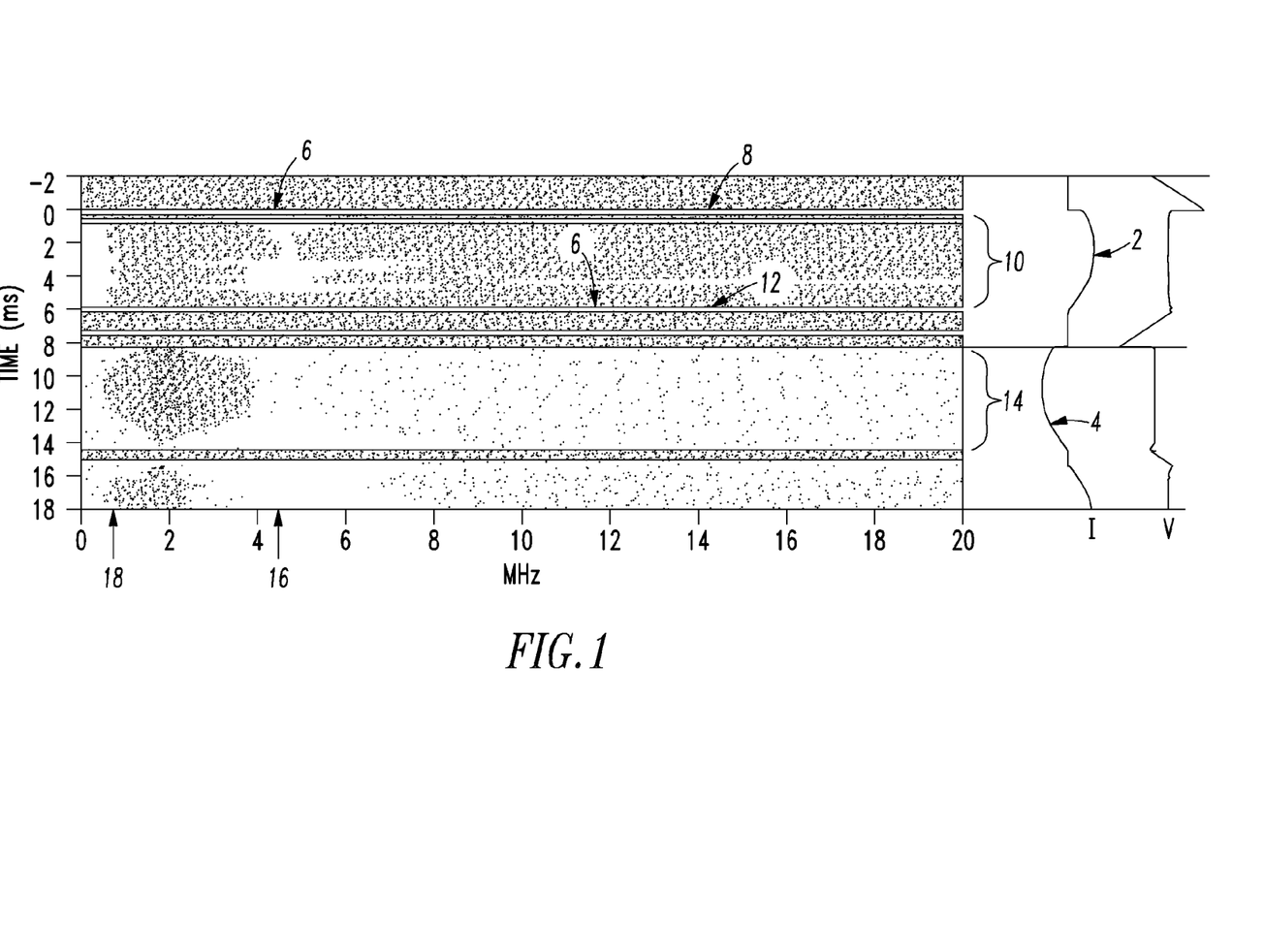
FIG. 1 shows a plot of high frequency magnitude versus frequency and time, and plots of current and voltage versus time for a resistive/inductive load with an undesired series arc.
Figure 2:
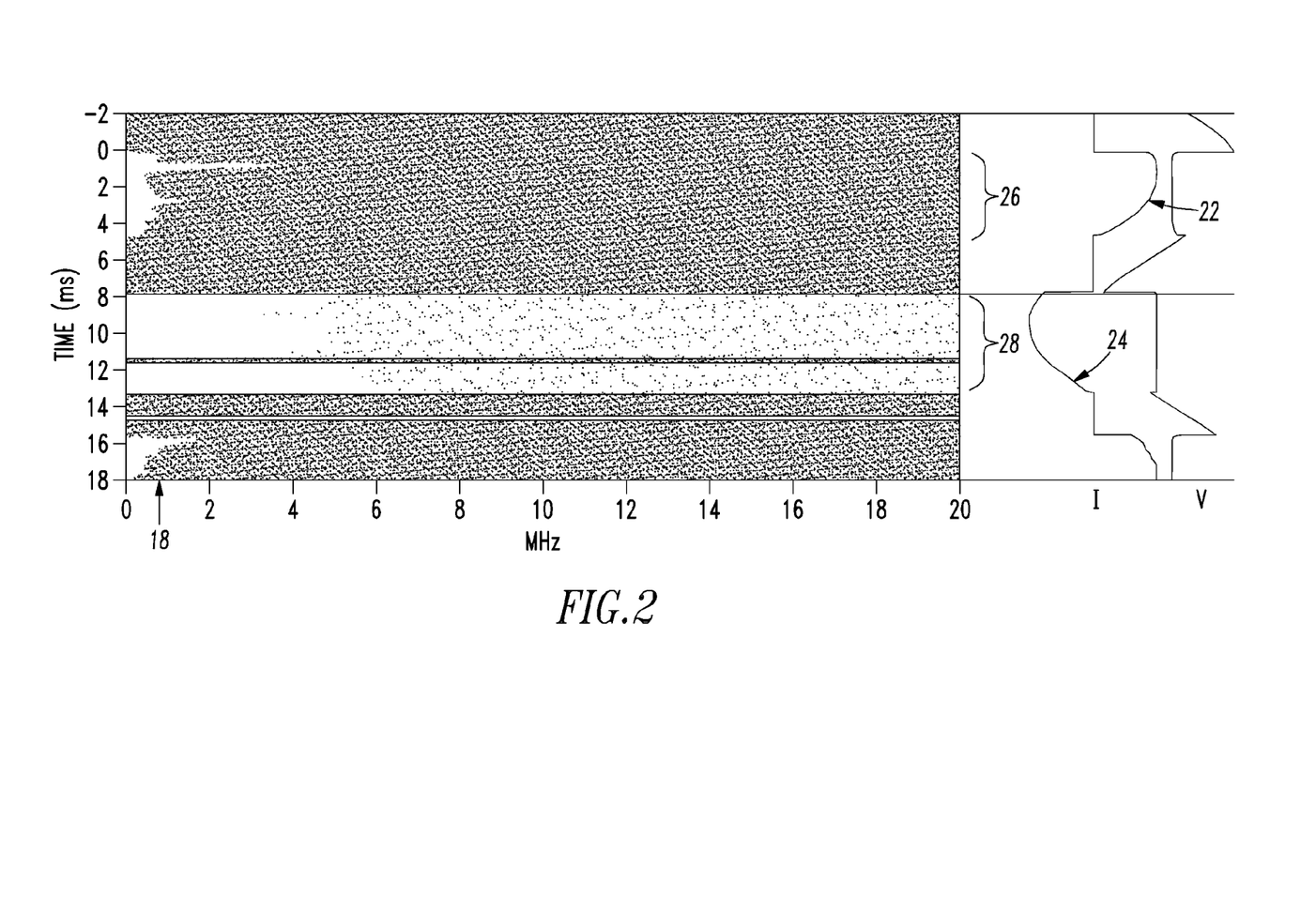
FIG. 2 shows a plot of high frequency magnitude versus frequency and time, and plots of current and voltage versus time for a resistive load with an undesired series arc.
Figure 3:
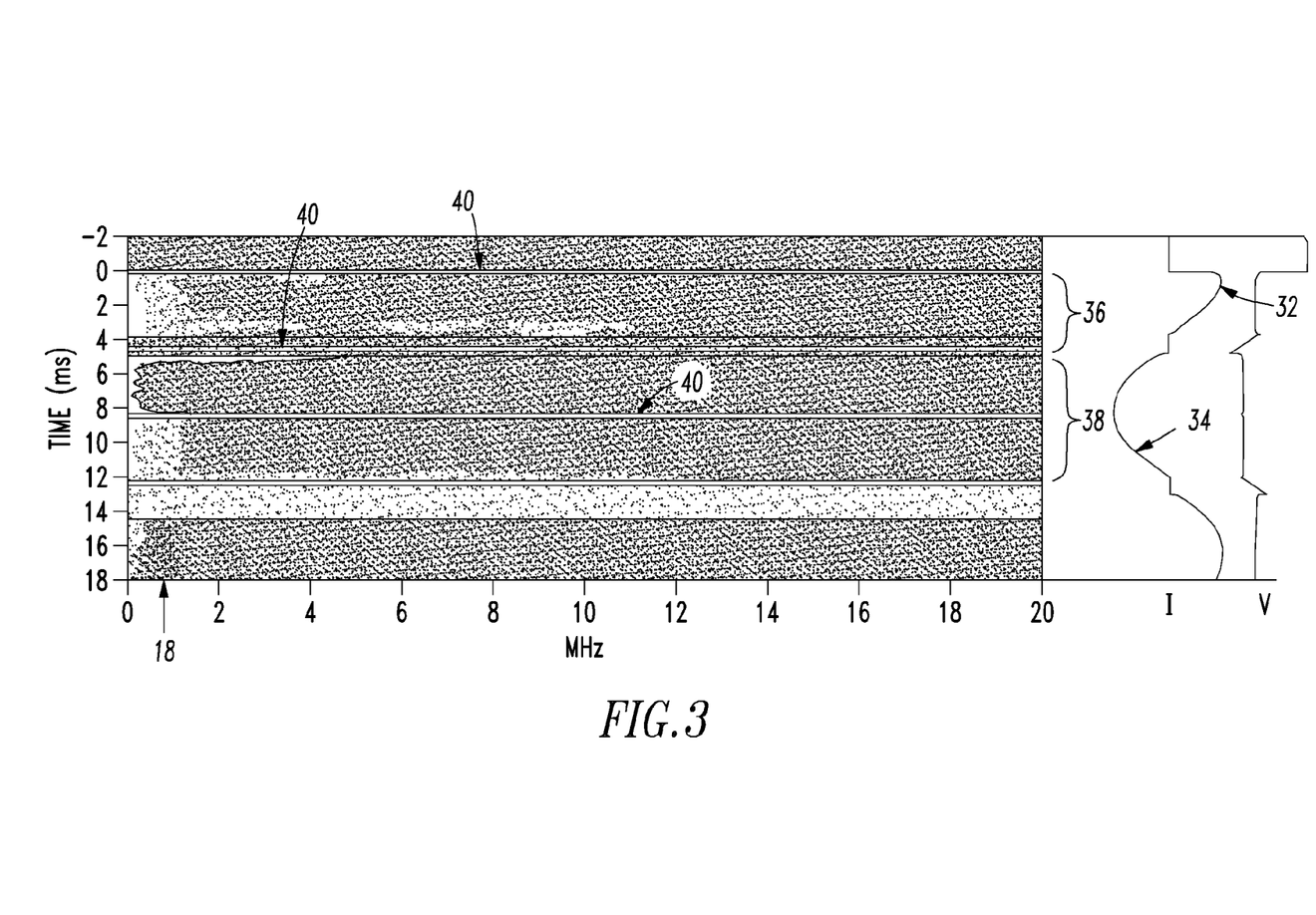
FIG. 3 shows a plot of high frequency magnitude versus frequency and time, and plots of current and voltage versus time for a resistive/inductive load with an undesired series arc at a relatively higher current than that of FIG. 1.

Referring to FIGS. 1-3, in the left (with respect to FIGS. 1-3) portion of the plots, black stippling corresponds to relatively lower magnitudes of RF activity, and white corresponds to relatively higher magnitudes of RF activity. It will be appreciated that a color plot (not shown) could show greater detail of the various relatively lower magnitudes and relatively higher magnitudes of RF activity.

FIG. 1 illustrates asymmetry for a resistive/inductive load (not shown) with an undesired series arc. Here, the nominal voltage is 120 $V_{RMS}$, the nominal current is 4.8 $A_{RMS}$, and the load is a 25 Ω wirewound resistance. The asymmetric electrodes (not shown) are C—Cu and the reference level for RF activity is 0 dBm. The current plot versus time includes an upper (with respect to FIG. 1) portion corresponding to a graphite cathode 2, and a lower (with respect to FIG. 1) portion corresponding to a copper cathode 4. The plot of high frequency magnitude versus frequency includes cathode spot bursts 6, an ignition spike 8, a relatively low RF activity portion 10 corresponding to the graphite cathode 2 (copper anode), an extinction spike 12, a relatively high RF activity portion 14 corresponding to the copper cathode 4 (graphite anode), and a relatively increased intensity portion 16 due to a corresponding relatively low circuit impedance, and a noise floor 18 at about 1 MHz.

FIG. 2 illustrates asymmetry for a resistive load (not shown) with an undesired series arc. Here, unlike FIG. 1, the load is a 25 Ω carborundum (e.g., carbon composition) resistance, which has a relatively lower inductance and consequently a relatively flatter response than that of a wirewound resistor. The current plot versus time includes an upper (with respect to FIG. 2) portion corresponding to a graphite cathode 22, and a lower (with respect to FIG. 2) portion corresponding to a copper cathode 24. The plot of high frequency magnitude versus frequency includes a relatively low RF activity portion 26 corresponding to the graphite cathode 22, a relatively high RF activity portion 28 corresponding to the copper cathode 24, and the noise floor 18 at about 1 MHz.

In contrast to FIGS. 1 and 2, there is no asymmetry for a motor load (not shown) with no series arc, where a universal motor (not shown) provides an intended arcing load but without asymmetric electrodes (not shown).

FIG. 3 shows that RF signals can disappear at relatively higher 60 Hz currents (e.g., without limitation, about 45 $A_{RMS}$ with a 2.7 Ω wirewound resistance (not shown)). The current plot versus time includes an upper (with respect to FIG. 3) portion corresponding to a graphite cathode 32, and a lower (with respect to FIG. 3) portion corresponding to a copper cathode 34. The plot of high frequency magnitude versus frequency includes a first relatively low RF activity portion 36 corresponding to the graphite cathode 32, a second relatively low RF activity portion 38 corresponding to the copper cathode 34, a number of cathode spot bursts 40, and the noise floor 18 at about 1 MHz. Also, a DC circuit would show the asymmetry in the RF current depending on whether the copper electrode was negative (cathode) or positive (anode). But, the asymmetry would not alternate as is the case with AC currents. DC series arcing fault polarity can be detected when using a UL 1699 Standard test apparatus.

The disclosed concept recognizes that an asymmetry exists in an RF signature when an undesired series arc is present. This allows discrimination between an undesired series arc and intended loads that happen to produce a relatively large amount of RF "noise". This asymmetry is inherent in a series arc that may occur, for example and without limitation, in electrical wiring (not shown) due to a copper wire (not shown) and carbonization of insulation (not shown). In the plots of FIGS. 1-3, a UL tester (not shown) is employed to replicate a series arc in electrical wiring (not shown) as per the UL 1699 Standard. The amplitude of the RF current depends on the electrode material due to the plasma characteristic of the arc. The RF current amplitude is dependent on the power line frequency (e.g., without limitation, 60 Hz) current amplitude because it controls the plasma parameters. This might limit the range of detection to a certain current level (e.g., without limitation, from about 2.4 $A_{RMS}$ to about 40 $A_{RMS}$). The RF current is also dependent on the frequency response of the power circuit. The power circuit impedance changes as a function of frequency. Different cable lengths alter the impedance of the power circuit, which can change the measured RF current amplitudes, but do not change the presence or absence of the RF current.

The discrimination between intended loads with relatively high harmonics and undesired series arcing can be accomplished by many different types of electronic circuits. One example circuit is a conventional high pass filter (not shown), with a cutoff frequency above the background noise level (e.g., without limitation, greater than about 1 MHz). This high pass filter can detect the presence of an unsymmetrical high frequency signal for a predetermined number of cycles. For example, for each half cycle, a count is incremented if the high frequency signal is above a threshold for each polarity. For example, a first polarity (Polarity1) can correspond to the positive half cycle and a second polarity (Polarity2) can correspond to the negative half cycle. If the absolute value of the difference in counts for the first and second polarities is greater than a predetermined threshold, then an arc fault is detected and, for example and without limitation, a corresponding circuit breaker is tripped. This is shown by Equation 1.

If |Polarity1_count−Polarity2_count|>threshold, then detect an arc fault    (Eq. 1)

wherein:
Polarity1_count is the count for the first polarity, Polarity1;
Polarity2_count is the count for the second polarity, Polarity2, and
threshold is a suitable predetermined threshold value.

Arcing currents of less than about 2.4 $A_{RMS}$ generally show both positive and negative half cycle broadband high frequency signals. Currents greater than or equal to about 2.4 $A_{RMS}$ show broadband high frequency signals when the copper electrode is the cathode and the graphite electrode is the anode. A narrow broadband signal is present at the ignition and extinction transients of both polarities. Occasionally, there can be a broadband signal present for the graphite cathode, especially for relatively low currents as exhibited by voltage fluctuations.

Figure 4:
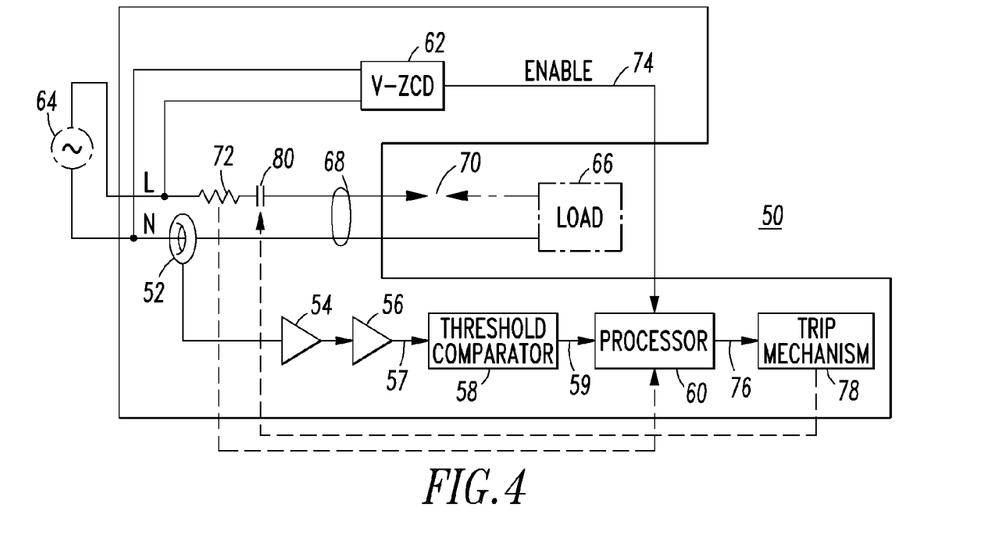
FIG. 4 is a block diagram in schematic form of a circuit interrupter in accordance with embodiments of the disclosed concept.
Figure 5:
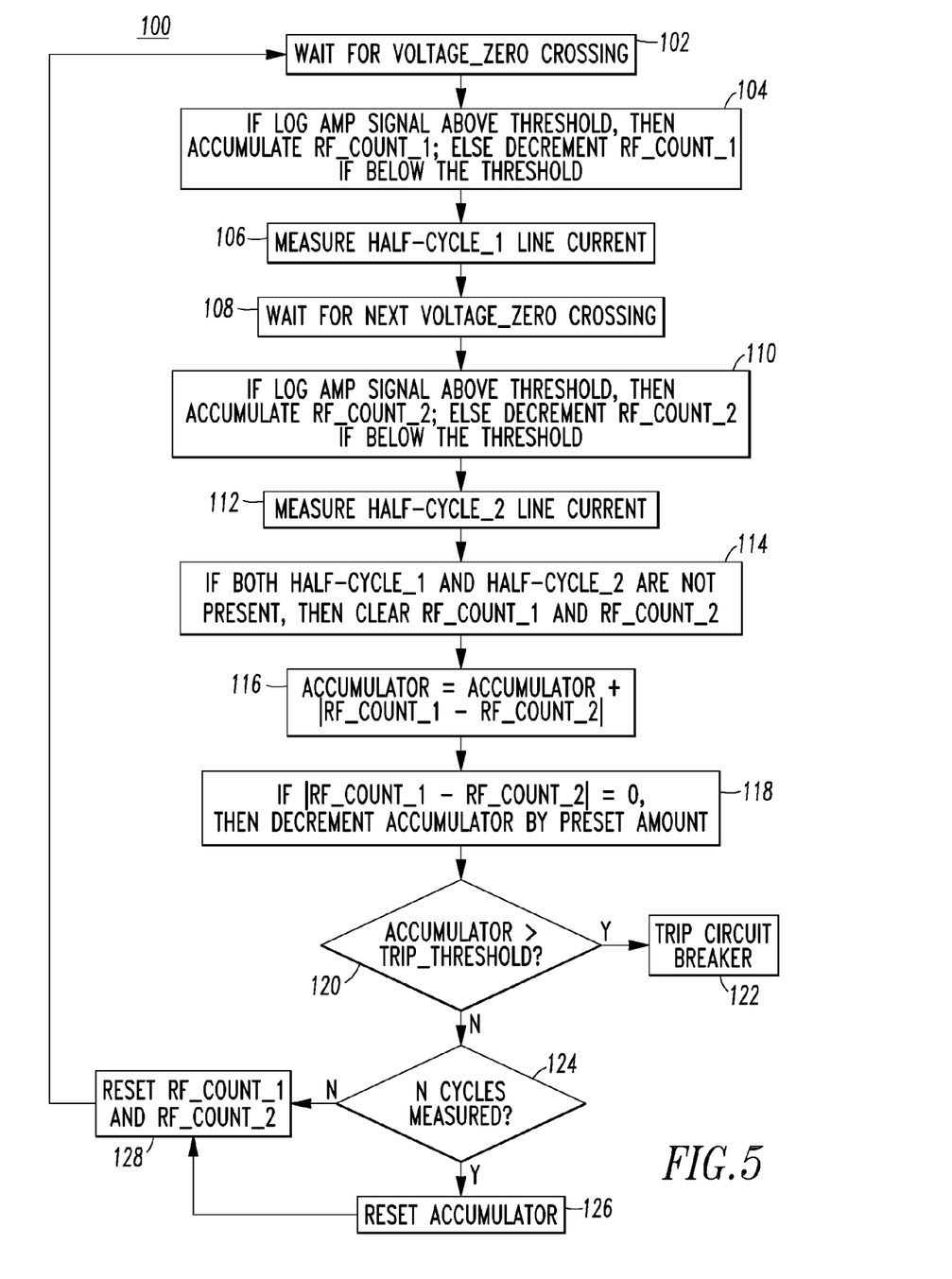
FIG. 5 is a flowchart of a routine for the processor of FIG. 4.

The disclosed circuit of FIGS. 4 and 5 shows one example way to achieve the desired outcome. Alternatively, a wide range of different sensors, circuit topologies (e.g., without limitation, a linear amplifier rather than a log amplifier), and algorithms can be employed. For example, in a log amplifier (logarithmic converter), the output voltage is proportional to the logarithm of the input voltage.

Referring to FIG. 4, an apparatus, such as the example electrical switching apparatus 50, includes a high frequency current sensor 52, a high frequency filter 54 (which may be part of the high frequency current sensor 52) (e.g., without limitation, $f_c$> about 1 MHz), an amplifier, such as a demodulator or the example log amplifier 56, a threshold comparator 58, a processor 60 and a voltage zero crossing detector (V-ZCD) 62. The electrical switching apparatus 50 is disposed between a power source, such as the example 60 Hz power source 64 (shown in phantom line drawing), and a load 66 (shown in phantom line drawing). The corresponding power circuit 68 includes an undesired series arcing fault 70.

Although an example high frequency current sensor 52 in the form of a current transformer is shown, such a high frequency current sensor could alternatively be a shunt 72. The voltage zero crossing detector 62 provides an enable signal 74 to the processor 60 as will be discussed. The processor 60 outputs a trip signal 76 to a trip mechanism 78 that causes separable contacts 80 in the power circuit 68 to responsively open.

The disclosed concept can be employed to detect undesired series arcing in any electrical circuit (e.g., without limitation, AC; the example power circuit 68; another electrical circuit), such as for AC series arc detection. Some non-limiting applications of the apparatus 50 include a circuit interrupter, a circuit breaker, a receptacle, another electrical protective device, or an electrical monitoring device.

One example application involves carbonization of insulation (not shown) and a copper conductor (not shown), although the disclosed concept is not limited to copper conductors. For example, typically, the carbon (not shown) bridges the copper conductor forming a carbon electrode (not shown) and a copper electrode (not shown). The separated carbon-copper electrodes in the UL 1699 Standard fixture are used to replicate the real-world situation.

The disclosed concept is disclosed in connection with an electrical switching apparatus, such as the example circuit breaker 50 for the example power circuit 68. Alternatively, the disclosed concept can be employed to detect undesired series arcing in any electrical circuit. For example and without limitation, the disclosed concept can be employed by a non-protective, monitoring device, such as a power line monitor, an arcing indicator, an arcing monitor and/or an arc polarity indicator. The disclosed concept may also be employed to better define the UL 1699 Standard used for testing arc fault circuit interrupters.

Figure 6:
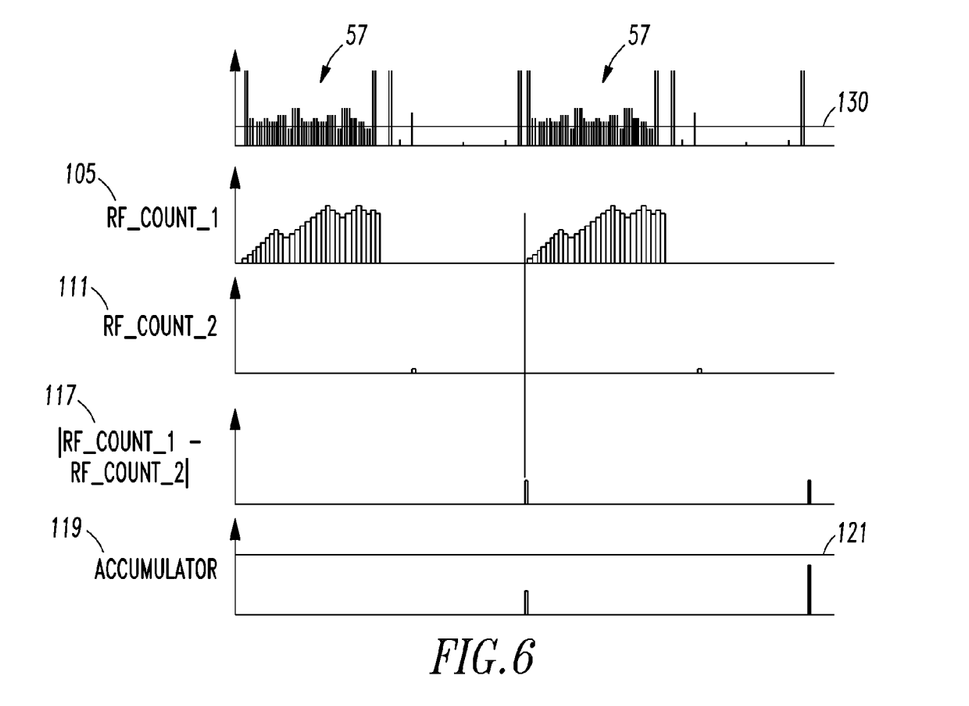
FIG. 6 shows plots of a high frequency magnitude, two counters, an absolute value difference, and an accumulator of FIG. 5 versus time.

Referring to FIG. 5, an example routine 100 for the processor 60 of FIG. 4 is shown. First, at 102, the routine 100 waits for the detection of a voltage zero crossing between the negative half cycle and the positive half cycle by using the enable signal 74 of FIG. 4. Next, at 104, it is determined if the output signal 59 of the threshold comparator 58 is true, which is so if the output signal 57 of the log amplifier 56 is greater than a first threshold for the positive half cycle. If so, this causes the responsive accumulation of a first count (RF_count_1) 105 (FIG. 6). Otherwise, the first count is decremented. Then, at 106, a first current is measured for the positive half cycle employing a signal from the shunt 72. Next, at 108, the routine 100 waits for the detection of a voltage zero crossing between the positive half cycle and the negative half cycle by using the enable signal 74 of FIG. 4. After this detection, at 110, it is determined if the output of the threshold comparator 58 is true, which is so if the output signal of the log amplifier 56 is greater than the first threshold for the negative half cycle. If so, this causes the responsive accumulation of a second count (RF_count_2) 111 (FIG. 6). Otherwise, the second count is decremented. Then, at 112, a second current is measured for the negative half cycle employing a signal from the shunt 72. Next, at 114, it is determined if both the positive half cycle and the negative half cycle are present from the measured first current, at 106, and the measured second current, at 112. If not, then both the first count 105 (e.g., without limitation, in the range of 0 to about 128; any suitable value depending upon processor speed) and the second count 111 (e.g., without limitation, in the range of 0 to about 128; any suitable value depending upon processor speed) are zeroed. Next, at 116, an accumulator 119 (e.g., without limitation, in the range of zero to a range of about two to about 60 depending upon the alternating current level, for example, about two for relatively high current (e.g., without limitation, about 45 $A_{RMS}$) and about 60 for relatively low current (e.g., without limitation, less than or about 2 $A_{RMS}$) (FIG. 6) is incremented by an absolute value 117 (e.g., without limitation, in the range of 0 to about 128; any suitable value depending upon processor speed) (FIG. 6) of the difference between the first count 105 and the second count 111.

Then, at 118, it is determined if the absolute value of the difference between the first count 105 (FIG. 6) and the second count 111 (FIG. 6) is zero. If so, then the accumulator 119 (FIG. 6) is responsively decremented by a predetermined value (e.g., without limitation, one; any suitable value). Next, at 120, it is determined if the accumulator 119 is greater than a trip threshold 121 (e.g., without limitation, about two; any suitable larger value) (FIG. 6). If so, then, at 122, a series arc fault is responsively indicated (e.g., by tripping the circuit breaker 50; by outputting an alert or other suitable indication). On the other hand, at 124, if a number, n, of cycles have occurred, then the accumulator 119 is zeroed at 126. Otherwise, or after 126, at 128, the first count 105 and the second count 111 are zeroed, before step 102 is repeated.

FIG. 6 shows example plots of the high frequency magnitude of the output signal 57 of the amplifier 56 (FIG. 4), a threshold 130 (e.g., without limitation, in the range of about −60 dBm to about −10 dBm; any suitable threshold) of the threshold comparator 58, first and second counts 105,111, absolute value difference 117, accumulator 119 and trip threshold 121 versus time.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An apparatus for a power circuit providing an alternating current to a load, said apparatus comprising:
 a high frequency current sensor structured to cooperate with said power circuit to provide a high frequency current signal;
 a voltage zero crossing detector structured to cooperate with said power circuit to provide a voltage zero crossing signal;
 a high pass filter structured to provide a filtered current signal from the high frequency current signal;
 a threshold comparator structured to provide an output when the filtered current signal exceeds a predetermined value; and
 a processor structured to receive the voltage zero crossing signal and the output of the threshold comparator and output a trip signal in response to undesired series arcing by detecting an unsymmetrical high frequency signal for a predetermined number of cycles,
 wherein each of the predetermined number of cycles includes a positive half cycle and a negative half cycle, and
 wherein said unsymmetrical high frequency signal includes a first high frequency signal for the positive half cycle and a second high frequency signal for the negative half cycle, with an asymmetry between the first and second high frequency signals.

2. The apparatus of claim 1 wherein said alternating current is in the range from about 2.4 $A_{RMS}$ to about 40 $A_{RMS}$.

3. The apparatus of claim 1 wherein said load is a resistive load.

4. The apparatus of claim 1 wherein said load is a resistive/inductive load.

5. The apparatus of claim 1 wherein the high pass filter is part of the high frequency current sensor and includes a cutoff frequency greater than about 1 MHz.

6. The apparatus of claim 1 wherein said apparatus is an electrical switching apparatus.

7. The apparatus of claim 6 wherein said electrical switching apparatus is selected from the group consisting of a circuit interrupter, a circuit breaker, a receptacle, and an electrical protective device.

8. The apparatus of claim 1 wherein said apparatus is an electrical monitoring device.

9. The apparatus of claim 1 wherein an amplifier is disposed between said high pass filter and said threshold comparator.

10. The apparatus of claim 9 wherein said amplifier is selected from the group consisting of a log amplifier, a linear amplifier and a demodulator.

11. A method of detecting a series arc fault of an electrical circuit, said method comprising:
   sensing a high frequency signal caused by the series arc fault;
   for a number of pairs of alternating current half cycles including a positive half cycle and a negative half cycle,
      incrementing a first count if the high frequency signal is above a first threshold for the positive half cycle,
      incrementing a second count if the high frequency signal is above the first threshold for the negative half cycle, and
      determining if an absolute value of the difference between the first count and the second count is greater than a second threshold, and then responsively detecting the series arc fault
   detecting a voltage zero crossing between the positive half cycle and the negative half cycle or between the negative half cycle and the positive half cycle;
   inputting the high frequency signal by a log amplifier and outputting a corresponding signal;
   determining if the corresponding signal is greater than the first threshold for the positive half cycle and responsively accumulating the first count, and otherwise decrementing the first count;
   measuring first current for the positive half cycle;
   determining if the corresponding signal is greater than the first threshold for the negative half cycle and responsively accumulating the second count, and otherwise decrementing the second count;
   measuring second current for the negative half cycle;
   determining if both the positive half cycle and the negative half cycle are present from the measured first current and the measured second current and incrementing an accumulator by an absolute value of the difference between the first count and the second count, and otherwise, zeroing the first count and the second count;
   determining if the absolute value of the difference between the first count and the second count is zero and responsively decrementing the accumulator by a first predetermined value; and
   determining if the accumulator is greater than a second predetermined value and responsively indicating a series arc fault.

12. The method of claim 11 further comprising for the accumulator not being greater than the second predetermined value:
   determining if a number of cycles have been measured and responsively zeroing the accumulator; and
   zeroing the first count and the second count.

* * * * *